United States Patent
Cole

Patent Number: 5,260,971
Date of Patent: Nov. 9, 1993

[54] APPARATUS AND METHODS EMPLOYING DISTRIBUTION PRESERVING TOMLINSON PRECODING IN TRANSMISSION OF DIGITAL DATA SIGNALS

[75] Inventor: Paul D. Cole, Fairfield, Conn.

[73] Assignee: General DataComm, Inc., Middlebury, Conn.

[21] Appl. No.: 651,563

[22] Filed: Feb. 6, 1991

[51] Int. Cl.$^5$ .............................. H04L 25/49
[52] U.S. Cl. .......................... 375/34; 375/60; 375/58
[58] Field of Search .............. 375/12, 14, 11, 58, 375/60, 34, 39, 7, 99; 371/43

[56] References Cited

U.S. PATENT DOCUMENTS 4,535,443  8/1985  Korevaar ........................... 375/7
4,837,766  6/1989  Yoshida ............................ 375/17

Primary Examiner—Curtis Kuntz
Assistant Examiner—T. Ghebretinsae
Attorney, Agent, or Firm—David P. Gordon

[57] ABSTRACT

A transmitter is provided with a distribution preserving Tomlinson coder which predistorts shaped data signals such that the power of each data signal exiting the coder is substantially similar to the power of the data signal entering the coder and such that upon transmission of the predistorted data signal over a channel, the effect of ISI of the channel is substantially removed. The transmitter is primarily intended for coded modulation systems utilizing a "coset" code, and the predistortion is preferably accomplished according to a linear function $$x_k + \sum_{l=1}^{} a_l x_{k-l} = r_k - s_k + \sum_{l=1}^{} b_l(r_{k-l} - s_{k-l})$$

where $r_k$ is a data signal entering the coder, $a_l$ and $b_l$ are the coefficients of polynomials relating to the channel impulse response, $x_k$ is the predistorted data signal exiting the coder, and $s_k$ is a multiple of a given value (N) which is chosen to cause $x_k$ and $r_k$ to occupy identical defined regions in space, where the total length of each defined region is the given value N. One and two dimensional regions are disclosed which are chosen in several ways. Receivers which cooperate with the provided transmitters are also provided. The receivers receive a sequence of signals, and process the sequence to provide a sequence of signals whose k'th term is an estimate of $r_k - s_k$. From the estimate of $r_k - s_k$, the receiver generates an estimate of $x_k$ by multiplying the received estimate by the channel ISI. From the estimate of $x_k$ and the estimate of $r_k - s_k$, the receiver determines the particular value of $s_k$, and hence the value of an estimate of $r_k$.

36 Claims, 2 Drawing Sheets

APPARATUS AND METHODS EMPLOYING DISTRIBUTION PRESERVING TOMLINSON PRECODING IN TRANSMISSION OF DIGITAL DATA SIGNALS

BACKGROUND OF THE INVENTION

This invention generally relates to the transmission and receipt of data over telecommunications channels via the use of modems. More particularly, this invention relates to apparatus and methods for modem equalization which predistort data signals in a transmitter prior to sending the signals over a channel.

Data signals which are sent over a channel from a transmitter to a receiver are often corrupted by the inherent characteristics of the channel. Those inherent characteristics include the inability of a channel to provide a perfect response to a signal; i.e. the state of the channel at a previous moment in time affects the response of the channel at a later moment in time. In the art, this is known as intersymbol interference or ISI. In addition to ISI, data signals are also subjected to noise. Both the noise and ISI reduce the ability of a receiver to determine exactly what was transmitted from the transmitter.

In attempting to correct for ISI, it is common in the art to supply an equalizer in the receiver. The function of the equalizer is to correct for the ISI of the received signals so that the initial data can be recovered. With an equalizer in the receiver, typically, a known sequence of data signals (i.e. a training sequence) is sent from the transmitter to the receiver. Being that the data signal sequence itself is known, and the signals being received are known, it is possible for the equalizer first to determine the effects of the channel (i.e. the channel coefficients) on the transmitted signals, and then to compensate for those effects via any of several processes such as linear equalization or decision feedback equalization. Linear equalization functions by multiplying the incoming signals by the inverse of the ISI. While the ISI is generally removed from the incoming signals in this manner, noise inherent in the data transmission is undesirably simultaneously amplified. Additional details of linear equalization may be obtained by reference to Lee, Edward A. and Messerschmitt, David G., *Digital Communication;* (Kluwer Academic Publishers, 1988).

Decision feedback equalization avoids the noise amplification problems of linear equalization. However, in recreating the ISI via feedback, decision feedback equalization runs the risk of error propagation, as any decision errors that are made are fed back. Additional details of decision feedback equalization may be obtained by reference to Lee, Edward A. and Messerschmitt, David G., *Digital Communication;* (Kluwer Academic Publishers, 1988).

In response to the problems of linear and decision feedback equalization, M. Tomlinson, "New Automatic Equalizer Employing Modulo Arithmetic"; *Electronics Letters Vol.* 7, (March, 1971) pp. 138-139, suggested that equalization occur in the transmitter rather than in the receiver. In other words, the signals should be predistorted in the transmitter in such a manner that would cancel out the ISI of the channel upon transmission. As a result, after travel through the channel, the signals being received by the receiver would correspond to those signals which were generated by the transmitter prior to the predistortion, except for noise. The noise accompanying the data would not be amplified.

In more mathematical terms, if a series of data points $r_k$ are to be sent from the transmitter to the receiver, the Tomlinson scheme precodes the data according to a linear function:

$$x_k \Sigma_{l \geq 1} h_l x_{k-l} = r_k \bmod M$$

where $x_k$ is the ISI corrected (i.e. predistorted) signal which is transmitted over the channel, $r_k$ is the precorrected selected signal point, and $h_l$ are the coefficients of a polynomial which describes the channel's impulse response (i.e. ISI).

While Tomlinson precoding is generally effective, the manner in which Tomlinson processes the signals prior to transmission causes signals having a desired power distribution which provides coding gain (e.g. as seen in U.S. Ser. Nos. 07 535,329 and 07/640 260 which are hereby incorporated by reference herein) to lose that gain. In other words, if the Tomlinson precoding is to be used, there is no benefit in providing a signal constellation having a desired "shape" or power distribution, as the Tomlinson precoding substantially destroys desired power distributions of coded signals. While for certain data transmission schemes this feature is acceptable, in high speed modems (e.g. 19.2 kbits/sec), it is advantageous that any gain available be maintained.

Recently, in Forney Jr., G. David, "Trellis Shaping", *IEEE Information Theory Workshop, CCITT Study Group XVII & Working Parties,* Geneva Oct. 15-23, 1990, and in Forney Jr., G. David, "Trellis Precoding: Combined Coding, Precoding and Shaping for Intersymbol Interference Channels", *IEEE Information Theory Workshop, CCITT Study Group XVII & Working Parties,* Geneva Oct. 15-23, 1990, Forney proposed an equalization scheme which avoids the drawbacks of both the equalization in the receiver, and the Tomlinson precoding methods. As set forth in the Forney articles, Trellis encoded and modulated data signals are predistorted to account for ISI in a manner which simultaneously provides minimum possible energy of the transmitted signal. While the Forney method theoretically provides excellent results, it has several drawbacks. First, the shaping scheme of Forney adds considerable delay to the process of transmitting data. Second, the Forney method requires very complex processing.

SUMMARY OF THE INVENTION

It is therefore an object of the invention to provide a transmitter which predistorts data signals having a desired power distribution without destroying the power distribution of the data signals.

It is another object of the invention to provide a transmitter which straight-forwardly predistorts coded data signals while substantially maintaining the power distribution of those coded data signals.

It is a further object of the invention to provide a transmitter which predistorts coded data signals without introducing additional delay and which substantially maintains the power distribution of the coded data signals.

It is an additional object of the invention to provide a receiver having a decoder for decoding coded data signals which have been predistorted without destroying the power distribution of the coded data signals and which have been sent through a distorting channel.

It is yet a further object of the invention to provide a digital telecommunications system having a transmitter and receiver where predistorted shaped data signals are transmitted over a channel, and shaped data signals received by the receiver are decoded.

In accord with the objects of the invention, a transmitter is provided with precoding means which predistorts shaped data signals such that the power of each data signal exiting the precoding means is substantially similar to the power of the data signal entering the precoding means and such that upon transmission of the predistorted data signal over a channel, the effect of intersymbol interference of the channel is substantially removed. The transmitter of the invention is primarily intended for coded modulation systems utilizing a "coset" code, and the predistortion is preferably accomplished according to a linear function $$x_k + \sum_{l=1} a_l x_{k-l} = r_k - s_k + \sum_{l=1} b_l(r_{k-l} - s_{k-l})$$

where $r_k$ is a data signal entering the precoding means, $a_l$ and $b_l$ are the coefficients of polynomials relating to the channel impulse response, $x_k$ is the predistorted data signal exiting the precoding means, and $s_k$ is a multiple of a given value (N) which is chosen to cause $x_k$ and $r_k$ to occupy identical defined regions in space, where the total length and/or width of each defined region is the given value N. Where a one-dimensional system is utilized, $r_k$, $x_k$, and $s_k$ are preferably real numbers, and the regions of length N in space occupied by $x_k$ and $r_k$ are along a line, while where a two-dimensional system is utilized, $r_k$, $x_k$, and $s_k$ are preferably complex numbers, and $x_k$ and $r_k$ are located within areas located within two-dimensional regions which are Cartesian products of two one-dimensional regions.

According to preferred aspects of the invention, the regions may be chosen n different ways. In a first embodiment, regions are chosen as non-overlapping adjacent segments of equal length N. In a second embodiment, regions are chosen as non-overlapping adjacent segments of equal length N, except that zero is not in any region; i.e. $r_k$ and $x_k$ cannot equal zero. In a third embodiment, regions are chosen as the union of segments, wherein points having opposite values are in the same region, except that end points are treated differently. In two dimensions for all three cases, the imaginary portion of the signal is treated separately, but identically to the real portion of the signal.

For purposes of simplification, $s_k$ is preferably an even integer (i.e. N=2), $r_k$ is preferably a non-integer, and scaling prior to and after predistortion is utilized where necessary.

Further in accord with the objects of the invention, a receiver is provided with a decoder for decoding coded data signals which have been predistorted as summarized above. The receiver receives a sequence of signals, and processes the sequence to provide a sequence of signals whose k'th term is an estimate of $r_k-s_k$. From the estimate of $r_k-s_k$, the decoder of the receiver preferably generates an estimate of $x_k$ by multiplying the received estimate by the ISI. From the estimate of $x_k$ and the estimate of $r_k-s_k$, the decoder determines the particular value of an estimate of $s_k$, and hence the value of an estimate of $r_k$.

The telecommunication system invention preferably utilizes the above-summarized transmitter and the above-summarized receiver. The methods of the invention relate closely to transmitter, receiver, and system apparatus inventions.

Additional objects and advantages of the invention will become apparent to those skilled in the art upon reference to the detailed description taken in conjunction with the provided drawings.

DETAILED DESCRIPTION OF THE PREFERRED EMBODIMENTS

Figure 1:
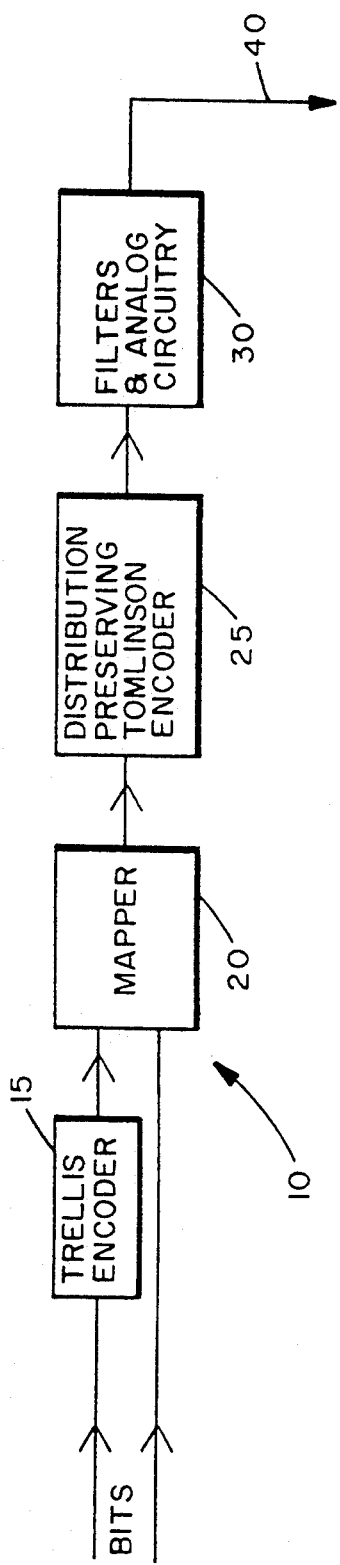
FIG. 1 is a block diagram of a portion of the transmitter of the invention.

A portion of a modem transmitter 10 is seen in FIG. 1. The preferred transmitter 10, as shown, includes a Trellis encoder 15, a mapper 20, a distribution preserving Tomlinson encoder 25, and filters and analog circuitry 30 for interfacing with a channel 40. Details of a Trellis encoder 15 may be found in Lee, Edward A. and Messerschmitt, David G., *Digital Communication;* (Kluwer Academic Publishers, 1988). The preferred mapper 20 of the invention is the mapper disclosed in U.S. Ser. Nos. 07/535,329 and 07/640,260 which were previously incorporated by reference herein. The mapper 20 preferably provides to the distribution preserving Tomlinson encoder 25 a series of data signals which are drawn from a "shaped" constellation; i.e. a series of data signals having a desired power distribution. The function of the distribution preserving Tomlinson encoder 25 is to predistort the data signals to account for channel ISI while simultaneously substantially maintaining the power distribution of the data signals being transmitted.

According to the invention, predistortion is accomplished in the distribution preserving Tomlinson encoder 25 according to a linear function $$x_k = \sum_{l\geq 1} a_l x_{k-l} = r_k - s_k + \sum_{l\geq 1} b_l(r_{k-l} - s_{k-l}) \quad (1)$$

where $r_k$ is the data signal generated by mapper 20 and forwarded to the encoder 25, $a_l$ and $b_l$ are the coefficients of polynomials relating to the channel impulse response, $x_k$ is the predistorted data signal exiting the distribution preserving Tomlinson encoder 25, and $s_k$ is a multiple of a given value (N) which is chosen to cause $x_k$ and $r_k$ to occupy identical defined regions in space, where the length and/or width of each defined region is the given value N. Where a one-dimensional system is utilized, $r_k$, $x_k$, and $s_k$ are preferably real numbers, and the regions of total length N in space occupied by $x_k$ and $r_k$ are along a line, while where a two-dimensional system is utilized, $r_k$, $x_k$, and $s_k$ are preferably complex numbers, and $x_k$ and $r_k$ are located within areas located within two-dimensional regions which are Cartesian products of the two one-dimensional regions.

Figure 2:
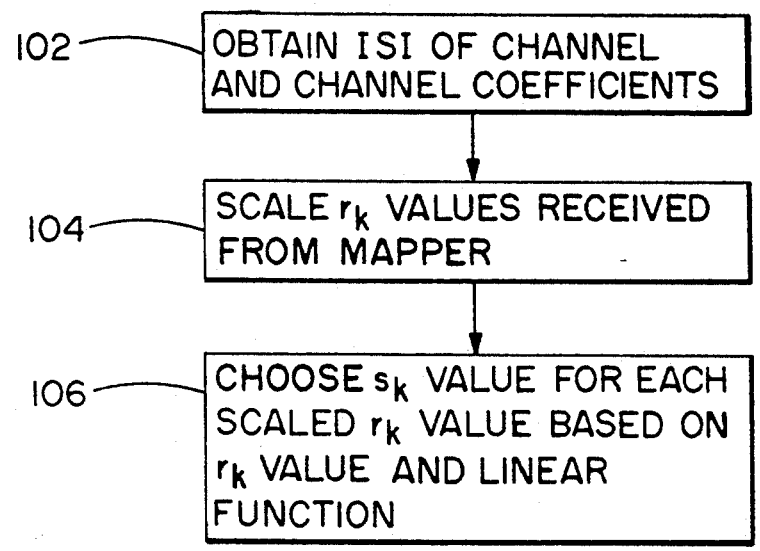
FIG. 2 is a flow chart of the method of the invention carried out in the distribution preserving Tomlinson encoder of FIG. 1.

More particularly, and as shown in FIG. 2, at step 102 the distribution preserving Tomlinson encoder 25 obtains the ISI of the channel 40 (e.g. from memory); the ISI having typically been determined initially by a receiver via the use of training sequence technology, and communicated back to the transmitter. As part of step 102, the channel coefficients $a_l$ and $b_l$ are obtained (e.g. from memory) such that $(1+\Sigma_{l\geq 1} a_l D^l)/(1+\Sigma_{l\geq 1} b_l D^l)$ approximates the channel impulse response polynomial $(1+\Sigma_{l\geq 1} h_l D^l)$. Then, at step 104, the $r_k$ value from the mapper 20 (which is preferably obtained via the mapping technique described in U.S. Ser. Nos. 07/535,329 and 07/640,260 which were previously incorporated by reference herein) is preferably scaled such that the input of mapper 20 is a half-integer; e.g. .... $-\frac{1}{2}$, $\frac{1}{2}$, 3/2, 5/2, etc. At step 106, a value for $s_k$ is chosen, based on the output $r_k$ of the mapper 20, and based on the linear function (1). The $s_k$ values are preferably even integers (i.e. they are multiples of 2), and are chosen to cause $x_k$ and $r_k$ to occupy identical defined regions in space, as set forth hereinafter in more detail.

According to preferred aspects of the invention, the defined regions in space which $x_k$ and $r_k$ occupy are preferably one dimensional regions (i.e. portions of a line), or two dimensional regions (i.e. areas of a plane), and may be chosen in different ways. According to a first embodiment, where regions are one dimensional, the regions are chosen as non-overlapping adjacent segments of equal length. According to a second embodiment of one dimensional regions, the regions are chosen as non-overlapping adjacent segments of equal length except that zero is not in any region; i.e. $r_k$ and $x_k$ cannot equal zero. According to a third embodiment of one dimensional regions, the regions are chosen as the union of segments, wherein points having opposite values are in the same region, except that end points are treated differently. In two dimensions for all three cases, the imaginary portion of the signal is treated separately, but identically to the real portion of the signal.

Describing in more mathematical terms the one-dimensional methods set forth above for picking the $s_k$ values, it can be said that ideally, and in accord with a first embodiment, a real line R can be partitioned into equal sized non-overlapping regions $G_n$ where n ranges over some index set. Based on this partitioning of R, the following holds: if $n_1 \neq n_2$, then $G_{n1}$ and $G_{n2}$ have no points in common; and R is the union of all regions $G_n$ where n ranges over the index set. As a result every real number $\alpha$ is located in exactly one region $G_n$, and the index $n(\alpha)$ of $\alpha$ can be defined such that $\alpha$ lies in $G_{n(\alpha)}$. Further defining $G_n$, each region $G_n$ may be chosen to be a fundamental region for the even integers in the real line R. In other words, for any real number $\beta$, there is exactly one even integer s such that $\beta-s$ lies in $G_n$.

Rewriting equation (1) set forth above for data signals being transmitted over a channel, each $x_k$ may be defined by $$x_k = r_k - s_k + \alpha_k \qquad (2)$$

where $s_k$ is the even integer for which $n(x_k)=n(r_k)$. In order to accommodate coding/decoding, the only restriction on the coding of the input sequence $\{r_k\}$ is that the hereinafter described receiver must recognize $\{r_k+z_k\}$ as a valid coded sequence whenever $\{r_k\}$ is a coded sequence and $\{z_k\}$ is a sequence of even integers. Further, in order to accommodate differential encoding/decoding, if $\{x_k\}$ is the output sequence generated by the input sequence $\{r_k\}$, then $\{-x_k\}$ should be the output sequence generated by the input sequence $\{-r_k\}$. To achieve this, either of the second or third embodiments which modify the ideal partitioning of line R (i.e. the first embodiment) may be utilized. According to the second embodiment, the index set is the set of odd integers, and $G_n=(n-1, n+1]$ if $n>0$, and $G_n=[n-1, n+1)$ if $n<0$. Thus, if $n=1$, $G_n$ is a region or segment from just above zero to two; if $n=3$, $G_n$ is a region or segment from just above two to four; if $n=-1$, $G_n$ is a region from minus two to just below zero. The only restriction on $r_k$ is that $r_k$ never equals zero. With such an arrangement, each $G_n$ is a fundamental region for the even integers in the real line R. The union of regions $G_n$ is the non-zero real numbers, and each region $G_n$ is of identical size.

The third embodiment for modifying the ideal partitioning of line R is to identify an index set of non-negative integers, and set $G_n=(-n-1, -n) \cup (n, n+1)$. In this case, where n equals zero, $G_n$ is the union of just above minus one to just below zero and just above zero to just below one; i.e. the region or segment from minus one to one, with the integers not included. If n equals one, $G_n$ is the union of the segment from just above minus two to just below minus one, and the segment from just above one to just below two. With this arrangement, the only restriction on $r_k$ is that it never be an integer. With the $r_k$ inputs coming from the mapper, this restriction is easily met via scaling.

Using the third embodiment, where $G_n=(-n-1, -n) \cup (n, n+1)$, and equation (2) set forth above, $s_k$ is chosen to be an even integer selected in the following manner. If $r_k+\sigma_k$ is not an integer, $s_k$ is selected so that $n(x_k)=n(r_k)$. If, on the other hand, $r_k+\sigma_k$ is an integer, $s_k$ is selected so that $x_k r_k \geq 0$ and so that $x_k=-n(r_k)-1$, $-n(r_k)$, $n(r_k)$, or $n(r_k)+1$. In other words, when $r_k+\sigma_k$ is not an integer, the even integer $s_k$ is chosen to bring $r_k$ into the same region as $x_k$. When $r_k+\sigma_k$ is an integer, then subtraction of an even integer $s_k$ will yield an integer, and $s_k$ is chosen in a well-defined manner such that if $r_k$ is negative, $x_k$ is either zero or negative (depending upon $\sigma_k$ and the index n), and if $r_k$ is positive, $x_k$ is either zero or positive (again depending upon $\sigma_k$ and the index n).

While the mathematics set forth above deals in only one dimension, the extension to two or more dimensions is straight-forward. For example, in two dimensions, the sequence $\{r_k\}$ is a sequence of complex numbers having real and imaginary portions: $\text{Re}(r_k)$ and $\text{Im}(r_k)$. The real and imaginary portions of the sequence $\{r_k\}$ are treated separately, but each is treated exactly as set forth above. Thus, for example, where the embodiment of $G_n=(-n-1, -n) \cup (n, n+1)$ is utilized, and the real portion of $r_k+\sigma_k$ is not an integer, $\text{Re}(s_k)$ is selected so that $n(\text{Re}(x_k))=n(\text{Re}(r_k))$; and if, on the other hand, the real portion of $r_k+\sigma_k$ is an integer, $\text{Re}(s_k)$ is selected so that $\text{Re}(x_k)\text{Re}(r_k)\geq 0$ and so that $\text{Re}(x_k)=-n(\text{Re}(r_k))-1$, $n(\text{Re}(r_k))$, $n(\text{Re}(r_k))$, or $n(\text{Re}(r_k))+1$. Likewise, where the imaginary portion of $r_k+\sigma_k$ is not an integer, $\text{Im}(s_k)$ is selected so that $n(\text{Im}(x_k))=n(\text{Im}(r_k))$; and if, on the other hand, the imaginary portion of $r_k+\sigma_k$ is an integer, $\text{Im}(s_k)$ is selected so that $\text{Im}(x_k)\text{Im}(r_k)\geq 0$ and so that $\text{Im}(x_k)=-n(\text{Im}(r_k))-1$, $-n(\text{Im}(r_k))$, $n(\text{Im}(r_k))$, or $n(\text{Im}(r_k))+1$.

Figure 3:
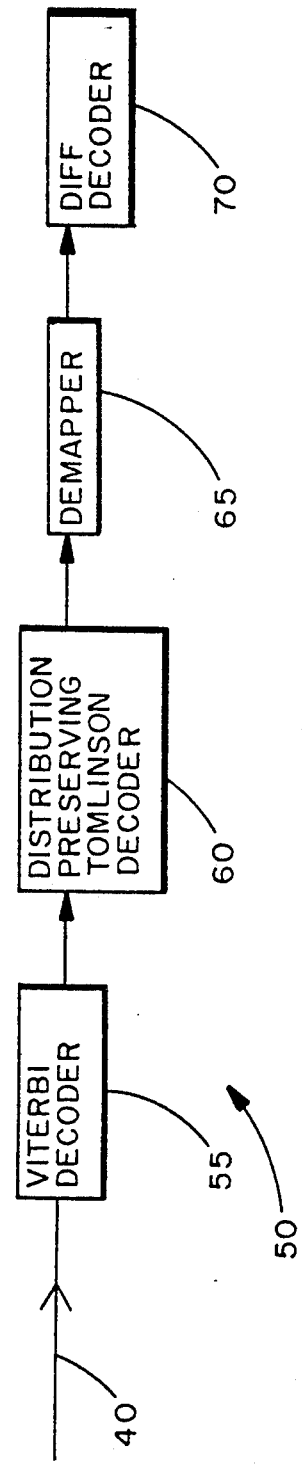
FIG. 3 is a block diagram of a portion of the preferred receiver of the invention.

Turning to FIG. 3, a block diagram of the receiver 50 of the invention is seen. The preferred receiver includes a Viterbi decoder 55, a distribution preserving Tomlinson decoder 60, a demapper 65, and in some embodiments a differential decoder 70. The function of the Viterbi decoder 55 is to receive the signals sent over channel 40, and to decode the Trellis coding so as to provide an estimate of $r_k - s_k$; i.e. $\widetilde{r_k - s_k}$, to the distribution preserving Tomlinson decoder. From $\widehat{r_k-s_k}$, the distribution preserving Tomlinson decoder 60 of the invention finds values for the series of $\tilde{r}_k$, which are estimates of $r_k$, as set forth in more detail with reference to FIG. 4. The $\tilde{r}_k$ values are then sent to the demapper 65 which provides to the differential decoder 70 a series of points drawn from a constellation.

Figure 4:
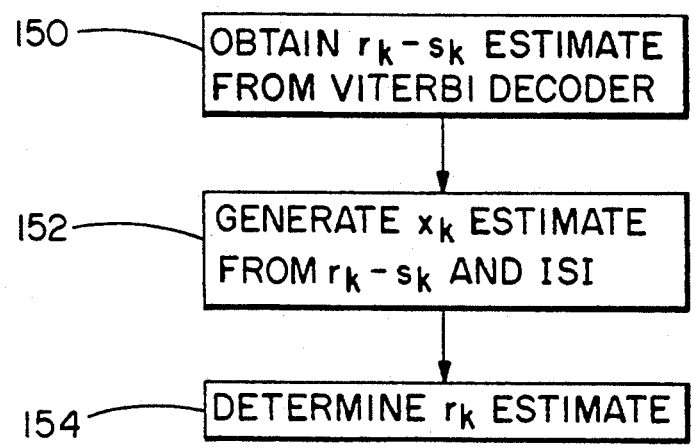
FIG. 4 is a flow chart of the method of the invention carried out in the distribution preserving Tomlinson decoder of FIG. 3.

Details of the manner in which the distribution preserving Tomlinson decoder 60 determines $\tilde{r}_k$ are seen with reference to FIG. 4. At step 150, the decoder 60 receives $\widehat{r_k-s_k}$ from the Viterbi decoder 55. At step 152, the coder 60 generates an estimate of $x_k$ ($\tilde{x}_k$) by multiplying $\widehat{r_k-s_k}$ by the previously determined ISI of the channel (e.g. stored in memory). At step 154, from the estimate $\tilde{x}_k$ (which provides an indication of the value n) and from the estimate $\widehat{r_k-s_k}$, the decoder 60 determines $\tilde{r}_k$ according to $$\tilde{r}_k = \widehat{r_k-s_k} + \tilde{s}_k \qquad (3)$$

where $\tilde{s}_k$ is an even integer estimate of $s_k$. Values of $\tilde{s}_k$ are determined according to the embodiment used in coding. For example, if the regions $G_n$ were chosen as non-overlapping adjacent segments of equal length or as non-overlapping adjacent segments of equal length except that zero is not in any region, the estimate $\tilde{s}_k$ is selected so that $n(\tilde{r}_k) = n(\tilde{x}_k)$. On the other hand, if the regions $G_n$ were chosen such that $G_n = (-n-1, -n) \cup (n, n+1)$, then in the decoder, if the estimate $\tilde{x}_k$ is not an integer, the estimate $\tilde{s}_k$ is selected so that $n(\tilde{r}_k) = n(\tilde{x}_k)$; while if the estimate $\tilde{x}_k$ is an integer, the estimate $\tilde{s}_k$ is selected so that the estimate $\tilde{r}_k$ lies in the union of segments defined by $(\tilde{x}_k - 1, \tilde{x}_k) \cup (\tilde{x}_k, \tilde{x}_k + 1)$.

While the above disclosure regarding the receiver of the invention deals in only one dimension, the extension to two or more dimensions is straight-forward. For example, in two dimensions, the sequence $\{\widehat{r_k-s_k}\}$ is a sequence of complex numbers having real and imaginary portions: $\text{Re}(\widehat{r_k-s_k})$ and $\text{Im}(\widehat{r_k-s_k})$. As with the transmitter, in the receiver, the real and imaginary portions are treated separately, but each is treated exactly as set forth above.

The telecommunication system invention preferably utilizes the transmitter and the receiver invention previously described. It will be appreciated that where a particular embodiment of the transmitter is utilized, a corresponding embodiment of the receiver should be utilized for compatibility.

There have been described and illustrated herein transmitters provided with (pre)coding means which predistorts shaped data signals such that the power of each data signal exiting the precoding means is substantially similar to the power of the data signal entering the precoding means and such that upon transmission of the predistorted data signal over a channel, the effect of intersymbol interference of the channel is substantially removed. Also described and illustrated herein are receivers which cooperate with such transmitters. While particular embodiments have been described, it will be appreciated that it is not intended that the invention be limited thereby, as it is intended that the invention be as broad in scope as the art will allow. Thus, while the transmitters of the invention were described as preferably having Trellis encoders, and the receivers of the invention were described as preferably having Viterbi decoders, it will be appreciated that the invention has application to transmitters and receivers employing different types of coding, or no coding at all. Also, while the invention suggested use of certain mappers providing coding gain, it will be appreciated that other mappers could be utilized. In fact, it will be appreciated by those skilled in the art that the mapping function can be integrated into the distribution preserving Tomlinson encoder such that the $r_k$ values are coset representatives (one for each coset), and the indices $n_k = n(x_k)$ are supplied by some means external to the invention.

Those skilled in the art will also appreciate that while the invention was set forth in detail for one dimensional signals, and for two dimensional signals based on a rectangular grid, the concepts of the invention also apply to two dimensional signals based on other grids (e.g. hexagonal) as well as to signals having three or more dimensions. In fact, even though the disclosed implementation of the invention has deficiencies when one or more of the coefficients $a_l$ is not zero, those skilled in the art will appreciate that various techniques can be utilized to overcome those deficiencies. Therefore, it will be apparent to those skilled in the art that yet other changes and modifications may be made to the invention as described without departing from the scope and spirit of the invention as so claimed.

I claim:

1. A transmitter for transmitting a series of telecommunications signals over a telecommunications channel, said transmitter comprising:

coding means for predistorting first telecommunications signals according to a linear function $$x_k + \Sigma_{l \geq 1} a_l x_{k-l} = r_k - s_k - \Sigma_{l \geq 1} b_l (r_{k-l} - s_{k-l})$$

to provide predistorted output second telecommunications signals, wherein $r_k$ represents a first telecommunications signal which is to be predistorted by said coding means, $a_l$ and $b_l$ represent coefficients of polynomials relating to the channel impulse response of said channel, $x_k$ represents a predistorted output second telecommunications signal, and $s_k$ is a multiple of a given value (N) which is chosen by said coding means to cause both $x_k$ and $r_k$ to occupy an identical one of a plurality of defined regions in space, where the total length and/or width of each defined region is the given value N; and interface means coupled to said coding means, said interface means for receiving said predistorted output second telecommunications signals and for processing said predistorted output second telecommunications signals for transmission on said channel.

2. A transmitter according to claim 1, wherein:
   $r_k$, $x_k$, and $s_k$ are real numbers, and the regions of length N in space are along a line.

3. A transmitter according to claim 2, wherein:
   said defined regions comprise non-overlapping adjacent segments of equal length N.

4. A transmitter according to claim 3, wherein:
   $s_k$ is selected so that $n(X_k) = n(r_k)$, where n is a region index function.

5. A transmitter according to claim 2, wherein:
   said defined regions comprise non-overlapping adjacent segments of equal length N, with zero not in any region, such that $r_k$ and $x_k$ are not zero.

6. A transmitter according to claim 5, wherein:
   $s_k$ is selected so that $n(x_k) = n(r_k)$, where n is a region index function.

7. A transmitter according to claim 2, wherein:
   said defined regions each comprise a union of segments, wherein points having opposite values are in the same region $J_n$, n is a region index, and $r_k$ is a non-integer real number.

8. A transmitter according to claim 7, wherein:
$s_k$ is selected so that $$n(x_k) = n(r_k) \text{ if } r_k + \sum_{l \geq 1} b_l(r_{k-l} - s_{k-l}) - \sum_{l \geq 1} a_l x_{k-l}$$

is not an integer,
and so that
$x_k r_k \geq 0$ and $x_k = -n(r_k) - 1, -n(r_k), n(r_k),$ or $n(r_k) + 1$ otherwise.

9. A transmitter according to claim 7, wherein:
$s_k$ is an even integer, and $r_k$ is a scaled data signal.

10. A transmitter according to claim 1, wherein:
$r_k$, $x_k$, and $s_k$ are complex numbers having real and imaginary portions, and $x_k$ and $r_k$ are located within identical two-dimensional regions which are Cartesian products of a defined real and a defined imaginary one-dimensional region, each of total length N.

11. A transmitter according to claim 10, wherein:
said defined real one-dimensional regions comprise non-overlapping adjacent segments of equal length N, and said defined imaginary one-dimensional regions comprise non-overlapping adjacent segments of equal length N.

12. A transmitter according to claim 11, wherein:
$s_k$ is selected so that $n(Re(x_k)) = n(Re(r_k))$, and so that $n(Im(x_k)) = n(Im(r_k))$, wherein n is a region index function.

13. A transmitter according to claim 10, wherein:
said defined real one-dimensional regions comprise non-overlapping adjacent segments of equal length N, with zero not in any region such that neither $Re(r_k)$ nor $Re(x_k)$ are zero, and said defined imaginary one-dimensional regions comprise non-overlapping adjacent segments of equal length N, with zero not in any region such that neither $Im(r_k)$ nor $Im(x_k)$ are zero.

14. A transmitter according to claim 13, wherein:
$s_k$ is selected so that $n(Re(x_k)) = n(Re(r_k))$, and so that $n(Im(x_k)) = n(Im(r_k))$, wherein n is a region index function.

15. A transmitter according to claim 10, wherein:
each said defined real one-dimensional region comprises a union of segments, wherein points having opposite values are in the same region $J_{n_r}$,
each said defined imaginary one-dimensional region comprises a union of segments, wherein points having opposite values are in the same region $J_{n_i}$, wherein
$n_r$ and $n_i$ are region indices, and neither $Re(r_k)$ nor $Im(r_k)$ is an integer.

16. A transmitter according to claim 15, wherein:
$s_k$ is selected so that $$n(Re(x_k)) = n(Re(r_k)) \text{ if } Re\left[r_k + \sum_{l \geq 1} b_l(r_{k-l} - s_{k-l}) - \sum_{l \geq 1} a_l x_{k-l}\right]$$

is not an integer, and
$Re(x_k)Re(r_k) \geq 0$ and $Re(x_k) = -n(Re(r_k)) - 1, -n(Re(r_k)), n(Re(r_k)),$ or $n(Re(r_k)) + 1$ otherwise,
and so that $$n(Im(x_k)) = n(Im(r_k)) \text{ if } Im\left[r_k + \sum_{l \geq 1} b_l(r_{k-l} - s_{k-l}) - \sum_{l \geq 1} a_l x_{k-l}\right]$$

is not an integer, and
$Im(x_k)Im(r_k) \geq 0$ and $Im(x_k) = -n(Im(r_k)) - 1, -n(Im(r_k)), n(Im(r_k)),$ or $n(Im(r_k)) + 1$ otherwise.

17. A transmitter according to claim 16, wherein:
$Re(s_k)$ and $Im(s_k)$ are even integers, and $Re(r_k)$ and $Im(r_k)$ are scaled data signals.

18. A receiver for receiving a series of signals over a channel, where the signals were first predistorted by a transmitter coding means according to a linear function $$x_k + \sum_{l \geq 1} a_l x_{k-l} = r_k - s_k + \sum_{l \geq 1} b_l(r_{k-l} - s_{k-l})$$

and then subjected to ISI of said channel and noise, wherein $r_k$ represents a signal which is to be predistorted according to said linear function, $a_l$ and $b_l$ represent coefficients of polynomials relating to said channel ISI, $x_k$ represents a signal which is subjected to said ISI, and $s_k$ is a multiple of a given value (N) which is chosen by said transmitter coding means to cause $x_k$ and $r_k$ to occupy an identical one of a plurality of defined regions in space, where the total length and/or width of each defined region is the given value N, said receiver comprising:

a) means for receiving said series of signals and generating from a k'th signal of said series of signals an estimate of $r_k - s_k$; and b) decoder means coupled to said means for receiving for generating from said estimate of $r_k - s_k$ and from an indication of said ISI an estimate of $x_k$, and for determining from said estimate of $x_k$ and said estimate of $r_k - s_k$ an estimate of $r_k$.

19. A receiver according to claim 18, wherein:
said estimate of $r_k$ is determined according to $\widetilde{r_k} = \widetilde{r_k - s_k} + \widetilde{s_k}$ where $\widetilde{r_k - s_k}$ is said estimate of $r_k - s_k$, and $\widetilde{s_k}$ is an estimate of $s_k$.

20. A receiver according to claim 19, wherein:
said estimate $\widetilde{s_k}$ is selected so that $n(\widetilde{r_k}) = n(\widetilde{x_k})$, wherein n is a region index function.

21. A receiver according to claim 19, wherein:
said estimate $\widetilde{s_k}$ is selected so that $n(\widetilde{r_k}) = n(\widetilde{x_k})$ when said estimate $\widetilde{x_k}$ is other than an integer, and so that said estimate $\widetilde{r_k}$ lies in the union of segments defined by $(\widetilde{x_k} - 1, \widetilde{x_k}) \cup (\widetilde{x_k}, \widetilde{x_k} + 1)$ when said estimate $\widetilde{x_k}$ is an integer, wherein n is a region index function.

22. A receiver according to claim 21, wherein:
$\widetilde{s_k}$ is an even integer.

23. A receiver according to claim 18, wherein:
$r_k$, $x_k$, and $s_k$ are complex numbers each having real and imaginary portion, and $x_k$ and $r_k$ are located within two-dimensional regions which are Cartesian products of two one-dimensional regions of total length N,
said estimate of $r_k - s_k$, said estimate of $x_k$, and said estimate of $r_k$ are complex numbers each having real and imaginary portions.

24. A receiver according to claim 23, wherein:

said estimate of $r_k$ is determined according to $Re(\tilde{r}_k) = Re[\widetilde{r_k - s_k}] + Re(\tilde{s}_k)$ and $Im(\tilde{r}_k) = Im[\widetilde{r_k - s_k}] + Im(\tilde{s}_k)$, where $Re[\widetilde{r_k - s_k}]$ is said real portion of said estimate of $r_k - s_k$, $Re(\tilde{s}_k)$ is the real portion of an estimate of $s_k$, and $Im[\widetilde{r_k - s_k}]$ is said imaginary portion of said estimate of $r_k - s_k$, and $Im(\tilde{s}_k)$ is the imaginary portion of an estimate of $s_k$.

25. A receiver according to claim 24, wherein:
said estimate $\tilde{s}_k$ is selected so that $n(Re(\tilde{r}_k)) = n(Re(\tilde{x}_k))$, and $n(Im(\tilde{r}_k)) = n(Im(\tilde{x}_k))$, where n is a region index function.

26. A receiver according to claim 24, wherein:
said estimate $\tilde{s}_k$ is selected so that $n(Re(\tilde{r}_k)) = n(Re(\tilde{x}_k))$ when $Re(\tilde{x}_k)$ is other than an integer, and $n(Im(\tilde{r}_k)) = n(Im(\tilde{x}_k))$ when $Im(\tilde{x}_k)$ is other than an integer, and so that $Re(\tilde{r}_k)$ lies in the union of segments defined by
$(Re(\tilde{x}_k) - 1, Re(\tilde{x}_k))$ U $(Re(\tilde{x}_k), Re(\tilde{x}_k) + 1)$ when $Re(\tilde{x}_k)$ is an integer, and so that $Im(\tilde{r}_k)$ lies in the union of segments defined by $(Im(\tilde{x}_k) - 1, Im(\tilde{x}_k))$ U $(Im(\tilde{x}_k), Im(\tilde{x}_k) + 1)$ when $Im(\tilde{x}_k)$ is an integer, wherein n is a region index function.

27. A receiver according to claim 26, wherein:
$Re(\tilde{s}_k)$ and $Im(\tilde{s}_k)$ are even integers.

28. A telecommunications system, comprising:
a) a telecommunications channel;
b) a transmitter for transmitting a series of data signals over said channel, said transmitter including coding means for predistorting data signals according to a linear function $$x_k + \Sigma_{l \geq 1} a_l x_{k-l} = r_k - s_k + \Sigma_{l \geq 1} b_l(r_{k-l} - s_{k-l})$$

to provide predistorted output data signals, wherein $r_k$ represents a data signal which is to be predistorted by said coding means, $a_l$ and $b_l$ represent coefficients of polynomials relating to the channel impulse response of said channel, $x_k$ represents a predistorted output data signal, and $s_k$ is a multiple of a given value (N) which is chosen by said coding means to cause $x_k$ and $r_k$ to occupy an identical one of a plurality of defined regions in space, where the total length and/or width of each defined region is the given value N;
c) a receiver means for receiving a series of signals corresponding to said predistorted output data signals, said series of signals being said predistorted output data signals which were subjected to ISI of said channel and noise, said receiver means including means for generating from a k'th signal of said series of signals an estimate of $r_k - s_k$, and decoder means for generating from said estimate of $r_k - s_k$ and from an indication of said ISI an estimate of $x_k$, and for determining from said estimate of $x_k$ and said estimate of $r_k - s_k$ an estimate of $r_k$.

29. A method for predistorting telecommunications signals in a coding means for a telecommunications transmitter prior to transmission over a telecommunications channel, said method comprising:
a) in said coding means, obtaining first telecommunications signals $r_k$ which are to be predistorted; and
b) predistorting said first telecommunications signal $r_k$ according to a linear function $$x_k + \Sigma_{l \geq 1} a_l x_{k-l} = r_k - s_k + \Sigma_{l \geq 1} b_l(r_{k-l} - s_{k-l})$$

to provide predistorted output second telecommunications signals $x_k$, wherein $a_l$ and $b_l$ represent coefficients of polynomials relating to the channel impulse response of said channel, and $s_k$ is a multiple of a given value (N) which is chosen by said coding means to cause $x_k$ and $r_k$ to occupy an identical one of a plurality of defined regions in space, where the total length and/or width of each defined region is the given value N.

30. A method according to claim 29, wherein:
$r_k$, $x_k$, and $s_k$ are real numbers,
the regions of length N in space are along a line,
said defined regions comprise non-overlapping adjacent segments of equal length N, and
$s_k$ is selected so that $n(x_k) = n(r_k)$, where n is a region index function.

31. A method according to claim 29, wherein:
$r_k$, $x_k$, and $s_k$ are real numbers,
the regions of length N in space are along a line,
said defined regions comprise non-overlapping adjacent segments of equal length N, with zero not in any region, such that $r_k$ and $x_k$ are not zero, and
$s_k$ is selected so that $n(x_k) = n(r_k)$, where n is a region index function.

32. A method according to claim 29, wherein:
$r_k$, $x_k$, and $s_k$ are real numbers,
the regions of length N in space are along a line,
said defined regions each comprise a union of segments, wherein points having opposite values are in the same region $J_n$, n is a region index, and $r_k$ is a non-integer real number, and
$s_k$ is selected so that $$n(x_k) = n(r_k) \text{ if } r_k + \sum_{l \geq 1} b_l(r_{k-l} - s_{k-l}) - \sum_{l \geq 1} a_l x_{k-l}$$

is not an integer,
and so that
$x_k r_k \geq 0$ and $x_k = -n(r_k) - 1, -n(r_k), n(r_k),$ or $n(r_k) + 1$ otherwise.

33. A method according to claim 29, wherein:
$r_k$, $x_k$, and $s_k$ are complex numbers having real and imaginary portions, and $x_k$ and $r_k$ are located within identical two-dimensional regions which are Cartesian products of one defined real one-dimensional region of total length N and one defined imaginary one-dimensional region of total length N,
said defined real one-dimensional regions comprise non-overlapping adjacent segments of equal length N, and said defined imaginary one-dimensional regions comprise non-overlapping adjacent segments of equal length N,
$s_k$ is selected so that $n(Re(x_k)) = n(Re(r_k))$, and so that $n(Im(x_k)) = n(Im(r_k))$, wherein n is a region index function.

34. A method according to claim 29, wherein:
$r_k$, $x_k$, and $s_k$ are complex numbers having real and imaginary portions, and $x_k$ and $r_k$ are located within identical two-dimensional regions which are Cartesian products of one defined real one-dimensional region of total length N and one defined imaginary one-dimensional region of total length N,
said defined real one-dimensional regions comprise non-overlapping adjacent segments of equal length N, with zero not in any region such that neither $Re(r_k)$ nor $Re(x_k)$ is zero,
said defined imaginary one-dimensional regions comprise non-overlapping adjacent segments of equal length N, with zero not in any region such that neither $Im(r_k)$ nor $Im(x_k)$ is zero, and $s_k$ is selected so that $n(Re(x_k))=n(Re(r_k))$, and so that $n(Im(x_k))=n(Im(r_k))$, wherein n is a region index function.

35. A method according to claim 29, wherein:

$r_k$, $x_k$, and $s_k$ are complex numbers having real and imaginary portions, and $x_k$ and $r_k$ are located within identical two-dimensional regions which are Cartesian products of one defined real one-dimensional region of total length N and one defined imaginary one-dimensional region of total length N, each said defined real one-dimensional region comprises a union of segments, wherein points having opposite values are in the same region $J_{n_r}$, $n_r$ is a region index, and $Re(r_k)$ is not an integer.

each said defined imaginary one-dimensional region comprises a union of segments, wherein points having opposite values are in the same region $J_{n_i}$, $n_i$ is a region index, and $Im(r_k)$ is not an integer, $s_k$ is selected so that $$n(Re(x_k)) = n(Re(r_k)) \text{ if } Re\left[ r_k + \sum_{l \geq 1} b_l(r_{k-l} - s_{k-l}) - \sum_{l \geq 1} a_l x_{k-l} \right]$$

is not an integer, and
$Re(x_k)Re(r_k) \geq 0$ and $Re(x_k) = -n(Re(r_k))-1$, $-n(Re(r_k))$, $n(Re(r_k))$, or $n(Re(r_k))+1$ otherwise,
and so that $$n(Im(x_k)) = n(Im(r_k)) \text{ if } Im\left[ r_k + \sum_{l \geq 1} b_l(r_{k-l} - s_{k-l}) - \sum_{l \geq 1} a_l x_{k-l} \right]$$

is not an integer, and
$Im(x_k)Im(r_k) \geq 0$ and $Im(x_k) = -n(Im(r_k))-1$, $-n(Im(r_k))$, $n(Im(r_k))$, or $n(Im(r_k))+1$ otherwise,
where n is a region index function.

36. In a telecommunications transmitter which transmits a series of telecommunications signals over a telecommunications channel, an improvement comprising:

coding means for predistorting first telecommunications signals according to a linear function $$x_r + \sum_{l \geq 1} a_l x_{k-1} = r_k - s_k + \sum_{l \geq 1} b_l(r_{k-1} - s_{k-1})$$

to provide predistorted output second telecommunications signals for transmission by said transmitter, wherein $r_k$ represents a first telecommunications signal which is to be predistorted by said coding means, $a_l$ and $b_l$ represent coefficients of polynomials relating to the channel impulse response of said channel, $x_k$ represents a predistorted output second telecommunications signal, and $s_k$ is a multiple of a given value (N) which is chosen by said coding means to cause both $x_k$ and $r_k$ to occupy an identical one of a plurality of defined regions in space, where the total length and/or width of each defined region is the given value N.

* * * * *